June 30, 1964 S. HJERMSTAD 3,139,532

BLOCKING OSCILLATOR FREQUENCY DIVIDER USING A NON-LINEAR FEEDBACK AMPLIFIER FOR STABILIZATION

Filed March 25, 1960

INVENTOR
SVERRE HJERMSTAD

BY Joseph D. Pannone
ATTORNEY

United States Patent Office 3,139,532

Patented June 30, 1964

3,139,532

BLOCKING OSCILLATOR FREQUENCY DIVIDER USING A NON-LINEAR FEEDBACK AMPLIFIER FOR STABILIZATION

Sverre Hjermstad, North Hollywood, Calif., assignor to Raytheon Company, Lexington, Mass., a corporation of Delaware Filed Mar. 25, 1960, Ser. No. 17,634
8 Claims. (Cl. 307—88.5)

Figure 1:
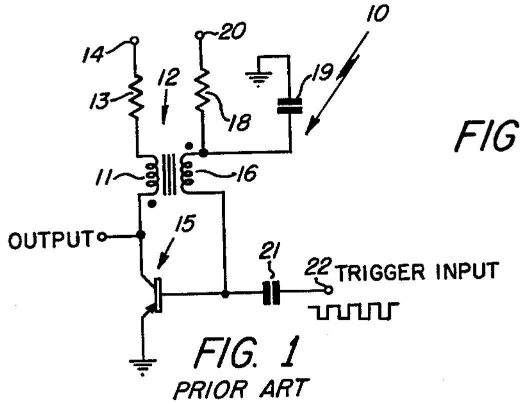
FIG. 1 PRIOR ART
Figure 1:
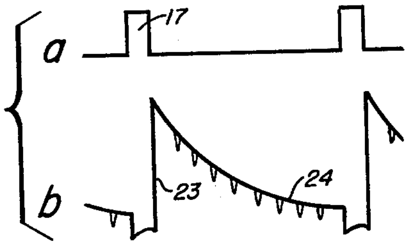

This invention relates to a frequency dividing circuit, and more particularly, to a frequency dividing circuit using a frequency divider of the blocking oscillator type for obtaining a lower frequency of pulses from an input signal having a high pulse frequency.

In frequency dividers of the blocking oscillator type, which utilizes an exponential discharge curve of a particular time constant to determine the countdown ratio of the divider, the maintenance of a stable countdown ratio usually depends upon accurate control of the supply voltage or voltages, the amplitude of the trigger pulse and circuit parameters. As is known, the usual blocking oscillator frequency divider generates an exponential discharge curve after conduction. This curve is applied to the control electrode circuit of the blocking oscillator together with superimposed trigger pulses to establish a voltage amplitude sufficient to trigger the oscillator after a predetermined number of trigger pulses. However, the slope of the exponential discharge curve used to achieve a useful frequency division ratio has the unfavorable character of being relatively flat in the region where the trigger pulses cause the blocking oscillator to fire. In this region, the difference in amplitude of adjacent trigger pulses when added to the relatively flat discharge curve is so small that relatively small changes in the aforementioned values of discharge voltage and pulse amplitude cause undesirable triggering by one or more adjacent pulses. This changes the frequency dividing ratio at random according to the particular pulse being utilized to achieve triggering. It is, therefore, desirable to provide a blocking oscillator having a discharge curve of a particular shape in which the slope at the desired time of oscillator triggering is steep enough so that the amplitudes of adjacent trigger pulses never correspond to the amplitude of the desired triggering pulse and the usual changes in trigger amplitude, supply voltages, and circuit parameters are ineffective to cause triggering by the wrong pulse.

In accordance with the blocking oscillator of the invention, a discharge curve having a slope of a characteristic to prevent mistriggering is achieved by introducing a nonlinear amplifier in the discharge curve positive feedback circuit. This amplifier provides greater amplification in the feedback path only in the region of the desired triggering. This is achieved by providing in the control circuit of the nonlinear amplifier a unidirectional current device, such as a diode, which conducts to produce increased amplifier gain and a steeper discharge curve in the desired region. In this manner, the desired trigger pulse is amplified several times more than the adjacent pulses and the frequency division ratio is undisturbed by the usual changes in power supply voltage, trigger amplitude, and circuit parameters. In addition, a curve of similar steepness, without the use of said amplifier, requires very large supply voltages, generally impractical and above the voltage rating of most semiconductor devices.

Figure 2:
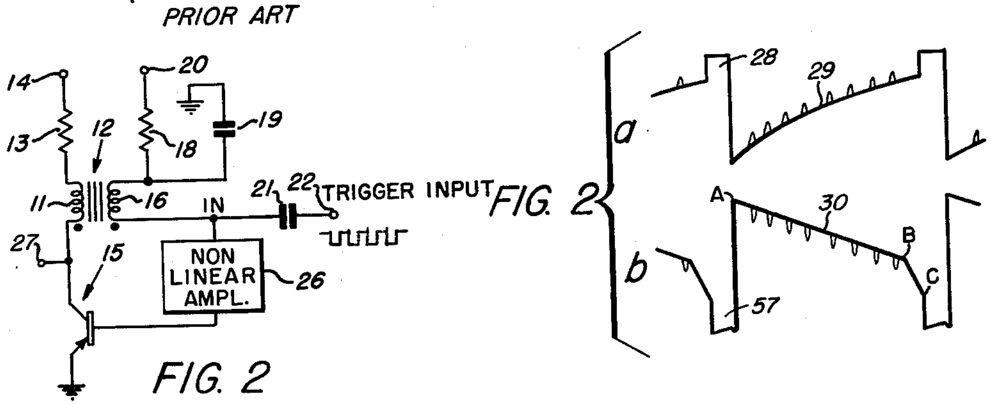

Other objects and advantages of this invention will become apparent as the description thereof progresses, reference being had to the accompanying drawing wherein:

FIG. 1 is a circuit diagram of a well-known blocking oscillator circuit;

FIG. 1*a* shows a typical output wave form of the circuit shown in FIG. 1;

FIG. 1*b* shows a typical discharge curve of the circuit shown in FIG. 1;

FIG. 2 is a circuit diagram of the blocking oscillator frequency divider of the present invention;

FIG. 2*a* shows the input voltage curve of the nonlinear amplifier;

FIG. 2*b* shows the voltage output curve of the nonlinear amplifier; and

Figure 3:
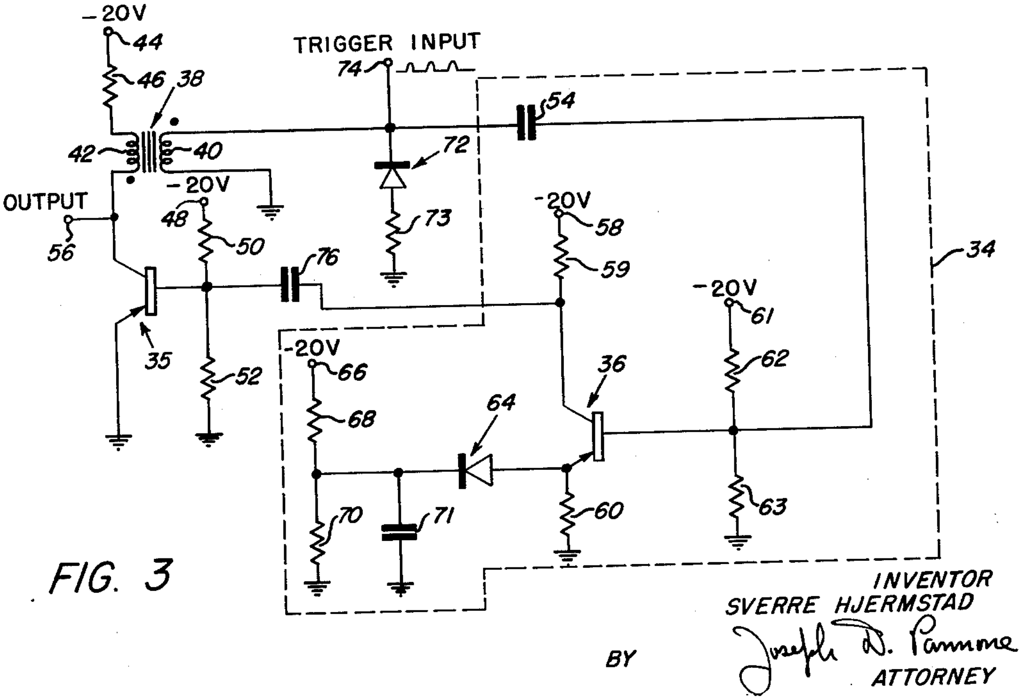

FIG. 3 is a schematic diagram of the blocking oscillator and nonlinear amplifier of the invention.

FIG. 1 shows a well-known blocking oscillator 10 in which primary winding 11 of transformer 12 is connected in series with a resistor 13, a source of supply voltage at terminal 14, and the emitter and collector of a semiconductor device, such as transistor 15. A secondary winding 16 of transformer 12 is poled to provide positive feedback and is connected in series with resistor 18, across which is connected shunt-timing capacitor 19, the base of transistor 15, and a source of supply voltage at terminal 20. A series of input trigger pulses are applied to the base of transistor 15 by way of capacitor 21 and input terminal 22. These pulses become superimposed upon the exponential discharge curve of the capacitor 19 following the output of a square pulse from the collector of transistor 15. At the termination of this pulse, the voltage backswing at point 23 of the curve shown in FIG. 1*b* occurs and thereafter the voltage at the base of transistor 15 decays exponentially. FIG. 1*a* shows a typical collector waveform 17 produced after transistor 15 has been triggered to the on condition in response to a trigger input pulse at terminal 22. Point 24 of the discharge curve of FIG. 1*b* shows the shape of the exponential voltage waveform in the region where the trigger pulse causes transistor 15 to conduct. However, the flatness of the curve in this region tends to permit any one of the adjacent trigger pulses to initiate conduction in the transistor in response to the aforementioned possible undesirable power supply fluctuations, changes in trigger pulse amplitude, or changes in circuit parameters.

In order to prevent the above-described triggering, a nonlinear amplifier 26, as shown in FIG. 2, is connected in series with transformer winding 16 and the base of transistor 15. In FIG. 2, it should be understood that where the elements are shown in FIG. 1, the same reference numbers are used. In operation, therefore, in the off period of the blocking oscillator transistor 15, no collector current flows, and the collector voltage is equal to the supply voltage applied at terminal 14. The transformer windings, together with the nonlinear amplifier 26, are phased to make the collector-to-base feedback of transistor 15 positive. This positive potential at the blocking oscillator transistor base is negative-going and eventually this transistor is triggered on.

The voltage at the collector-circuit end of the primary winding goes in a positive direction and a voltage is induced in the secondary. The phasing of transformer 12 causes a positive-going wave form to be applied to the nonlinear amplifier 26. Regeneration occurs until a temporary state of equilibrium is reached, and a square output pulse is obtained at terminal 27. FIG. 2*a* shows the regeneration pulse 28 and a curve 29 representing the voltage waveform input to the nonlinear amplifier 26. In accordance with the invention, a portion of the discharge curve of capacitor 19 is amplified by the nonlinear amplifier 26 and the slope of the discharge curve at the base of transistor 15 is made steeper in the region of the desired triggering pulse in a manner which will be described in detail with reference to FIG. 3.

Referring to FIG. 2*b*, the discharge curve 30 of capacitor 19 is shown having a steeper slope provided at points B to C than from points A to B. This steeper slope prevents triggering of the transistor 15 by more than a single pulse, which latter pulse occurs in the region of point C. This is the only portion of the curve of an amplitude sufficient to trigger transistor 15. Accordingly, mistriggering is prevented by the favorable steepness between points B and C provided by the nonlinear amplifier 26. This amplifier has a semiconductor device in the emitter circuit which conducts at a particular portion of the discharge curve to increase the amplification of the nonlinear amplifier and the steepness of the discharge curve. The manner in which this steepness is achieved will be described in detail with reference to the circuit diagram shown in FIG. 3.

FIG. 3 shows a schematic diagram of a transistor blocking oscillator circuit provided with a transistor nonlinear amplifier 34 in the positive feedback loop of the transistor blocking oscillator. The blocking oscillator circuit is provided with a blocking oscillator transistor 35, and the nonlinear amplifier 34 is provided with a transistor amplifier 36 connected in the positive feedback path of blocking oscillator transistor 35. To establish positive feedback, blocking oscillator transformer 38, herein shown as having a three-to-one turns ratio, is connected so that its secondary winding 40 is of the same polarity to the primary winding 42. This latter winding is connected in series with a source of —20 volts at terminal 44, a two-thousand-ohm resistor 46, and the collector of a 2N416-type transistor. The transistor 35 is biased to a normally conducting condition by applying to the transistor base a negative bias of twenty volts at terminal 48 and by means of a 390,000-ohm resistor 50 and 7,500-ohm resistor 52. When transistor 35 becomes conductive, collector current flows and the collector voltage goes in a positive direction from the supply voltage at terminal 44. The positively phased transformer windings apply a positive-going waveform 28 to capacitor 54 and also to the base of nonlinear amplifier 36. This causes the collector of transistor 36 and the base of transistor 35 to go more negative, as shown by pulse 57, and regeneration occurs until a temporary state of equilibrium is reached and an output pulse at terminal 56 is obtained. This output pulse is similar to pulse 17 shown in FIG. 1*a*.

It should be understood that transistor 36 is of the same type as transistor 35. The collector and emitter electrodes of transistor 36 are connected in series with a negative supply voltage of twenty volts at terminal 58, a three-thousand-ohm resistor 59, and a thirty-six-hundred-ohm bias resistor 60. In like manner, the base of transistor 36 receives a negative bias from the negative source of twenty volts at terminal 61 and voltage divider resistors 62 and 63 of twenty-four thousand and thirteen thousand ohms, respectively. A diode 64 is connected in the emitter circuit of transistor 36 and biased by a voltage divider connected to a negative supply voltage of twenty volts at terminal 66. The voltage divider consists of a ten-thousand-ohm resistor 68, in series with a ten-thousand-ohm resistor 70, across which latter resistor is shunted a .1 microfarad capacitor 71. Diode 64, therefore, conducts at a particular voltage level determined by the input voltage applied to the base of transistor 36 and the divider voltage at the cathode of diode 64.

Due to the voltage backswing at the termination of pulse 57, the voltage applied to capacitor 54 goes positive while the collector of transistor 36 also goes positive. This voltage will then decay exponentially according to the time constant of capacitor 54 and the circuit resistance associated therewith. A diode 72 is connected in series with a forty-seven-ohm resistor 73 to provide a more linear discharge path for capacitor 54, as shown in FIG. 2*a*. A series of positive trigger pulses are applied to terminal 74 and become superimposed upon the discharge curve. During this time interval, from point A to B of FIG. 2*b*, diode 64 is cut off and amplification through the nonlinear amplifier is rather small, although sufficient to maintain positive feedback to blocking oscillator transistor 35 through coupling capacitor 76. As the amplifier input voltage applied to the base of transistor 36 becomes less negative, it eventually causes diode 64 to conduct. This switches a low emitter impedance, that is capacitor 71, into the nonlinear amplifier stage and substantially increases the amplification of this stage. The waveform of the collector of transistor 36 is shown in FIG. 2*b*, wherein the letters AB represent the nonconducting time of diode 64 and BC is the conducting time. To avoid drifting of the knee of the waveform at point B and in order to provide accurately timed triggering, the bias network for the base of transistor 36 and voltage divider resistors 68 and 70 on the cathode side of the diode 64 are, preferably, returned to the same supply voltage. With this arrangement, the voltage at point B can change without causing the knee of the discharge curve to drift. In accordance with the invention, the heavily amplified trigger pulse added to the increased slope of the discharge curve at point C triggers the blocking oscillator transistor 35, without undesirable triggering by one or more adjacent pulses. The blocking oscillator cycle then repeats. In this manner, the countdown ratio of the frequency divider is not affected by supply voltage variations of from 15 to 25 volts, other parameters being constant, or a one-to-five variation in trigger pulse amplitude. As noted, merely increasing the steepness of the discharge curve by increasing the supply voltage is not feasible, since such voltages are impractical to obtain and exceed the ratings of most types of transistors.

This invention is not limited to particular details of construction, materials, and processes described, as many equivalents will suggest themselves to those skilled in the art. It is accordingly desired that the appended claims not be limited to the particular details of the embodiment disclosed herein except as defined by the appended claims.

What is claimed is:

1. A frequency divider circuit comprising a blocking oscillator having a predetermined oscillating cycle, said blocking oscillator including a voltage feedback circuit connected to feed back a portion of the output of said blocking oscillator to initiate oscillation in said blocking oscillator at a predetermined voltage level, means for applying a series of triggering pulses to said voltage feedback circuit, a continuously operating voltage amplifier connected in series with said voltage feedback circuit, and means coacting with said amplifier to increase the amplification of said voltage amplifier at a predetermined time in said oscillating cycle to increase the effective slope of the voltage of said feedback circuit in the region of a triggering pulse.

2. A frequency divider circuit comprising a blocking oscillator having a predetermined oscillating cycle, said blocking oscillator including a voltage feedback circuit connected in circuit with the input of said blocking oscillator to initiate oscillation in said blocking oscillator at a predetermined voltage level, means for applying a series of triggering pulses to said voltage feedback circuit, a continuously conducting voltage amplifier connected in series with said voltage feedback circuit, and means coacting with said amplifier to increase the amplification of said amplifier at a predetermined voltage level of said voltage feedback circuit to increase the effective slope of voltage in said feedback circuit in the region of a trigger pulse.

3. A frequency divider circuit comprising a blocking oscillator having a predetermined oscillating cycle, said blocking oscillator including a semiconductor device having a base-emitter control circuit, a continuously operating voltage amplifier stage, a voltage feedback circuit connected in series with said amplifier stage and said base-emitter control circuit, means including a capacitance in said voltage feedback circuit for producing an exponential voltage, means for superimposing a triggering pulse on said exponential voltage to cause said semiconductor device to conduct at a prescribed voltage level, and means in said amplifier stage to substantially increase the amplification of said amplifier stage at a predetermined time in said operating cycle to increase the effective slope of said exponential voltage in the region of said triggering pulse.

4. A frequency divider for generating recurring pulses comprising a blocking oscillator including a blocking oscillator semiconductor device having a base-emitter control circuit, a voltage feedback circuit including a capacitance and a voltage stabilized nonlinear amplifier having a bias circuit connected in series with said base-emitter control circuit, means causing said capacitance to produce a negative-going exponential voltage in said voltage feedback circuit, means for applying a series of pulses to said exponential voltage for initiating conduction in said semiconductor device in response to a single pulse at a predetermined voltage level, and diode means in the bias circuit of said nonlinear amplifier to substantially increase the amplification of said nonlinear amplifier at a predetermined time in the operating cycle of said blocking oscillator to increase the effective slope of the voltage in said feedback circuit in the region of one of said pulses.

5. A frequency divider for generating recurring pulses comprising a blocking oscillator including a blocking oscillator semiconductor device having a base-emitter control circuit, a voltage feedback circuit including a capacitance and a continuously operating nonlinear amplifier connected in series with said base-emitter circuit, means causing said capacitance to produce a negative-going exponential voltage in said voltage feedback circuit, means for applying a series of pulses to said exponential voltage for initiating conduction in said semiconductor device in response to a single pulse at a predetermined voltage level, and means coacting with said nonlinear amplifier for increasing the amplification of said nonlinear amplifier and the effective slope of the voltage in said feedback circuit in the region of said single pulse.

6. A frequency divider circuit comprising a blocking oscillator including a transistor having at least an emitter, base, and collector electrodes, means for establishing a voltage on said emitter electrode, means for establishing a voltage on said collector electrode, a regenerative feedback path from said collector electrode to said emitter electrode and to said base electrode, said feedback path comprising a pulse transformer having at least primary and secondary windings, said primary winding being connected to receive the output of said collector electrode, a voltage stabilized amplifier being connected in a series circuit with said base and emitter electrodes, and a unidirectional current flow device coacting with said amplifier to increase the amplification of said amplifier and the slope of voltage in said feedback path at a predetermined time in the operating cycle of said blocking oscillator.

7. A frequency divider circuit comprising a blocking oscillator including a transistor having at least an emitter, base, and collector electrodes, means for establishing a voltage on said emitter electrode, means for establishing voltage on said collector electrode, a regenerative feedback path from said collector electrode to said emitter electrode and to said base electrode, said feedback path comprising a pulse transformer having at least primary and secondary windings, said primary winding being connected to receive the output of said collector electrode, a voltage stabilized amplifier being connected in a voltage feedback circuit with said base and emitter electrodes, a unidirectional current flow device coacting with said amplifier to increase the amplification of said amplifier at a predetermined time in the operating cycle of said blocking oscillator, means including a capacitance in said voltage feedback circuit for producing an exponential voltage, means for superimposing a triggering pulse on said exponential voltage to cause said semiconductor device to conduct at a prescribed voltage level, and means in said amplifier stage to substantially increase the output of said voltage feedback circuit at a predetermined time in said operating cycle.

8. In combination, a blocking oscillator having a predetermined oscillating cycle, a capacitor in circuit with said blocking oscillator connected to discharge in an exponential manner, a voltage feedback circuit connected from the output to the input of said blocking oscillator to initiate oscillation in said blocking oscillator at a predetermined voltage level, means for applying a series of triggering pulses to said voltage feedback circuit, a voltage amplifier connected in series with said voltage feedback circuit, and means coacting with said voltage amplifier to increase the amplification of said amplifier and the output of said voltage feedback circuit at a predetermined time in said oscillating cycle independently of the discharge of said capacitor.

References Cited in the file of this patent

UNITED STATES PATENTS

| | | |
|---|---|---|
| 2,529,547 | Fisher | Nov. 14, 1950 |
| 2,562,228 | Atwood | July 31, 1951 |
| 2,717,961 | Johnstone | Sept. 13, 1955 |
| 2,820,899 | Sanford | Jan. 21, 1958 |
| 2,886,706 | Rogers | May 12, 1959 |